United States Patent
Takashima et al.

(10) Patent No.: US 7,514,115 B2
(45) Date of Patent: Apr. 7, 2009

(54) METHOD OF FORMING THIN FILM OF ORGANOMETALLIC COMPOUND, THIN FILM OF ORGANOMETALLIC COMPOUND, METHOD OF MANUFACTURING ORGANOELECTRONIC DEVICE EQUIPPED WITH THE SAME, ORGANOELECTRONIC DEVICE, METHOD OF MANUFACTURING ORGANIC ELECTROLUMINESCENCE, ORGANIC ELECTROLUMINESCENCE, AND ELECTRONIC APPARATUS

(75) Inventors: Takeshi Takashima, Fujimi-cho (JP); Katsuyuki Morii, Suwa (JP); Hirofumi Hokari, Chino (JP); Rie Makiura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 927 days.

(21) Appl. No.: 10/922,994

(22) Filed: Aug. 23, 2004

(65) Prior Publication Data
US 2005/0079277 A1 Apr. 14, 2005

(30) Foreign Application Priority Data
Sep. 9, 2003 (JP) ............................. 2003-316501

(51) Int. Cl.
*B05D 5/06* (2006.01)

(52) U.S. Cl. ..................... 427/66; 430/322; 430/395; 430/494; 430/311; 430/396; 428/690; 428/704; 428/917; 313/504; 313/506; 260/429.5; 260/429 J; 260/632 A; 427/64; 427/248.1

(58) Field of Classification Search ................. 427/66; 313/587; 430/322; 260/429.5; 428/690
See application file for complete search history.

(56) References Cited

U.S. PATENT DOCUMENTS

| | | | | |
|---|---|---|---|---|
| 3,716,567 A | * | 2/1973 | Termin et al. | ............... 556/40 |
| 5,981,150 A | * | 11/1999 | Aoki et al. | ................ 430/322 |
| 6,440,585 B2 | * | 8/2002 | Tadashi et al. | ............ 428/690 |
| 2002/0041926 A1 | * | 4/2002 | Miyashita et al. | ........... 427/66 |
| 2006/0153971 A1 | * | 7/2006 | Takehara | .................... 427/66 |

FOREIGN PATENT DOCUMENTS

JP A 1-220380 9/1989

OTHER PUBLICATIONS

Tang et al. "Organic Electroluminescent Diodes," American Institute of Physics, Appl. Phys. Lett., vol. 51, No. 12, Sep. 21, 1987, pp. 913-915.

* cited by examiner

*Primary Examiner*—Michael Barr
*Assistant Examiner*—Andrew Bowman
(74) *Attorney, Agent, or Firm*—Oliff & Berridge, PLC

(57) ABSTRACT

Aspects of the invention can provide a method of fabricating an organometallic compound film capable, by stably forming a film with the organometallic compound, of increasing bonding forces of junction interfaces and of realizing a hyper thin film, the organometallic compound film, and an organoelectronic device (e.g., an organic electroluminescence device, an organic solar battery, or an organic thin film transistor) and an electronic device equipped with the organometallic compound film are provided. The method of fabricating a thin film of an organometallic compound on a substrate, can include the step of forming an organic material by a liquid phase process and the step of forming metal by a vapor phase process to form a thin film of an organometallic compound composed of the organic material and the metal.

12 Claims, 11 Drawing Sheets

METHOD OF FORMING THIN FILM OF ORGANOMETALLIC COMPOUND, THIN FILM OF ORGANOMETALLIC COMPOUND, METHOD OF MANUFACTURING ORGANOELECTRONIC DEVICE EQUIPPED WITH THE SAME, ORGANOELECTRONIC DEVICE, METHOD OF MANUFACTURING ORGANIC ELECTROLUMINESCENCE, ORGANIC ELECTROLUMINESCENCE, AND ELECTRONIC APPARATUS

BACKGROUND OF THE INVENTION

1. Field of Invention

Aspects of the invention can relate to a method of forming a thin film of an organometallic compound, a thin film of an organometallic compound, a method of manufacturing an organoelectronic device (e.g., an organic electroluminescence device, an organic solar battery, or an organic thin film transistor), an organoelectronic device, and an electronic apparatus.

2. Description of Related Art

There have been various kinds of related organometallic compounds (organometallic complexes) whose applications have been widely spread to various fields. For example, related organic electroluminescence devices (hereinafter referred to as an organic EL device) having chelate complexes embedded in their compound structures and solar batteries. See, for example, Appl. Phys. Lett., 51,913 (1987) and Japanese Unexamined Patent Publication No. 1-220380.

In such applications as organic ELs and solar batteries, there are many examples in which laminated structures formed of thin film metallic complexes bound with electrodes. From the present view point, a method of stably fabricating thin films is very significant.

In related fabrication methods of, such thin films, the thin films have been fabricated using materials already combined as complexes by, for example, previously mixing ligands with metals. And, as fabrication processes of such thin films, not only vapor phase processes such as a vacuum deposition process but also liquid phase processes in which materials are deposited as their solutions have been used.

SUMMARY OF THE INVENTION

However, as a matter of fact, some of organometallic compound (organometallic complex) materials are so unstable as to be decomposed under influence of heat or the like during the forming processes to lose their functions. In particular, stacked structures are easy to be influenced in junction interfaces of the layers.

Aspects of the invention can provide a method of fabricating an organometallic compound film capable, by stably forming a film with the organometallic compound, of increasing bonding forces of junction interfaces and of realizing a hyper thin film, the organometallic compound film, and an organoelectronic device (e.g., an organic electroluminescence device, an organic solar battery, or an organic thin film transistor) and an electronic apparatus.

To achieve the above object, the invention can adopt the following exemplary configurations. A method of fabricating a thin film of an organometallic compound according to the invention is a method of fabricating a thin film of an organometallic compound on a substrate and can include the step of forming an organic matter by a liquid phase process and the step of forming metal by a vapor phase process to form a thin film of an organometallic compound composed of the organic matter and the metal.

Here, a liquid phase process is also called a wet process or a wet deposition process, and is a process of making a substrate and a liquid material be contacted with each other, and denotes an inkjet (droplet discharge) method, a spin-coat method, a slit-coat method, a dip-coat method, a spray deposition method, a printing method, a liquid discharge method, and so on. Note that after executing the liquid phase process, a thermal process for desiccating and heating the liquid material is generally executed.

In contrast, a vapor phase process is a process for depositing a desired gas material on a substrate in vacuum or in a vapor phase atmosphere, and denotes z vapor deposition process, a sputtering process, a CVD (chemical vapor deposition) process or the like.

Further, an organic matter denotes a ligand of a complex or the like, but is not limited thereto, what is more suitable for deposition by a liquid phase process because its molecule is easy to be decomposed by a vapor phase process. Further, metal denotes the central metal in a complex, but is not limited thereto, what is more suitable for deposition by a vapor phase process. Note that the order of the step of forming an organic matter and the step of forming metal is not limited for the present.

According to the invention, by depositing a desired organic matter by a liquid phase process and depositing a desired metal by a vapor phase process, a stable organometallic layer can be formed in the junction interface between the organic matter and the metal. Therefore, if an unstable organic material is used, the problem of decomposition or loss of function of the organic material caused by an influence of heat applied during the film forming process is no more occurs. Further, in a laminated structure, no influence is exerted to a junction surface of each layer. Accordingly, organometallic compounds can stably be formed as a film, thus increasing the bonding force of the junction interface. Further, since the complex layer is formed only in the junction interface, a very thin film of, for example, one molecule thick can be formed.

Further, assuming an organic matter is A and metal is B, by depositing the organic matter A by a liquid phase process and depositing metal B by a vapor phase process, the organometallic compound MAn (n denotes the valence of the metal M) can be formed simultaneously with the deposition.

Further, in the method of fabricating an organometallic compound thin film, a thin film of an organometallic compound can preferably be formed by forming an organic matter and then forming metal on the organic matter. Thus, the organometallic compound thin film can be formed in accordance with the previously formed organic matter. Further, if an inkjet method is used as a liquid phase process for forming an organic matter, the organic matter can be formed in a predetermined pattern, and accordingly, the thin film of the organometallic compound having a predetermined pattern can be formed.

Further, in the method of fabricating an organometallic compound thin film, a thin film of an organometallic compound is preferably formed by forming metal and then forming an organic matter on the metal. Thus, the organometallic compound thin film can be formed in accordance with the previously formed metal.

Further, in the method of fabricating an organometallic compound thin film, the liquid phase process is preferably a droplet discharge method. Thus, the organic matter can selectively be positioned and deposited by a droplet discharge method. Further, a number of kinds of organic matters can separately be coated in accordance with the kind of the object of droplet ejection.

Further, an organometallic compound of the invention is formed by the method of fabricating an organometallic compound thin film described previously. Therefore, the same advantages as described are obtained.

Further, the organometallic compound thin film according to the invention preferably has the thickness of one of equal to and less than 1 nm. Thus, a very thin film with the thickness of about one molecule can be formed.

Further, a method of fabricating an organoelectronic device according to the invention can include the step of forming an organic functional layer, the step of forming a charge transfer layer; and the step of forming an electrode. The step of forming a charge transfer layer comprises the step of forming an organic matter by a liquid phase process and the step of forming metal by a vapor phase process, whereby forming a thin film of an organometallic compound composed of the organic matter and the metal.

According to the invention, by depositing a desired organic matter by a liquid phase process and depositing a desired metal by a vapor phase process, a stable organometallic complex layer can be formed in the junction interface between the organic matter and the metal. Therefore, if an unstable organic material is used, the conventional problem of decomposition or loss of function of the organic material caused by an influence of heat applied during the film forming process is no more occurs. Further, in a laminated structure, no influence is exerted to a junction surface of each layer. Accordingly, organometallic compounds can stably be formed as a film, thus increasing the bonding force of the junction interface. Further, since the complex layer is formed only in the junction interface, a very thin film of, for example, one molecule thick can be formed.

Note that, in the invention, a charge transfer layer can denote an electron injection layer or an electron transfer layer which are film layers for supplying electrons to an organic functional layer and having an electron injection property or an electron transfer property, or a hole blocking layer for blocking electron holes and making them stay in an organic functional layer. Alternatively, it can denote a hole injection layer or a hole transfer layer which are film layers for supplying electron holes to an organic functional layer and having an electron hole injection property or an electron hole transfer property.

Further, in the method of fabricating an organoelectronic device, the organometallic compound can be preferably an organometallic complex, and the central atom of the organometallic complex preferably can include the same metallic element as at least one of composing elements of the electrode, and further, the organometallic complex is preferably a β-diketone complex.

Here, organometallic complexes having various structures, such as chelate complexes or crown ether complexes can be used. Among the above, complexes having the β-diketone based ligand (β-diketone complexes) are preferable because they are acidity reagents and multidentate ligands with oxygen to form stable metallic complexes.

Further, by using the same element for the central atom of the complex as the element composing the electrode, the bonding force of the interfacial surface therebetween can be further increased to provide a further enhanced charge transfer effect. In this case, it is sufficient that the complex takes the composing element of the cathode adjacent to the interfacial surface as its center atom, and if the cathode is formed of a plurality of thin films laminated with each other, it is enough that the center atom of the complex is the same as the composing element of the thin film disposed nearest to the electron injection layer out of the layers.

Further if the electron injection efficiency needs to be enhanced as a electronic device, the cathode can be preferably composed of a certain metallic element with low work function (e.g., alkali metal, alkali-earth metal, magnesium, or rare-earth elements). Note that such metallic elements are enough to present at least in the interfacial surface with the electron injection layer, and if, for example, the cathode is formed of a plurality of films laminated with each other, it is enough that only the nearest film to the electron injection layer is composed of the low work function metal element described above. Further, if the center atom of the complex is composed of the same metallic element with low work function (e.g., alkali metal, alkali-earth metal, magnesium, rare-earth elements), adhesiveness between the cathode and the electron injection layer can be enhanced, and electron injection barriers can also be reduced, resulting in a further enhanced light emission efficiency.

Further, in the method of fabricating an organoelectronic device, a thin film of an organometallic compound can be preferably formed by forming an organic matter and then forming metal on the organic matter in the step of forming a charge transfer layer. Thus, the organometallic compound thin film can be formed in accordance with the previously formed organic matter. Further, if an inkjet method (a droplet discharge method) is used as a liquid phase process for forming an organic matter, the organic matter can be formed in a predetermined pattern, and accordingly, the thin film of the organometallic compound having a predetermined pattern can be formed.

Further, in the method of fabricating an organoelectronic device, a thin film of an organometallic compound is preferably formed by forming metal and then forming an organic matter on the metal in the step of forming a charge transfer layer. Thus, the organometallic compound thin film can be formed in accordance with the previously formed metal. Further, if an inkjet method is used as a liquid phase process for forming an organic matter, the organic matter can be formed in a predetermined pattern, and accordingly, the thin film of the organometallic compound having a predetermined pattern can be formed.

Further, in the method of fabricating an organoelectronic device, the liquid phase process is preferably a droplet discharge method. Thus, the organic matter can selectively be positioned and deposited by a droplet discharge method. Therefore, for example, the organic matter can selectively be formed only on the predetermined kind of organic functional layer. Further, a number of kinds of organic matters can separately be coated in accordance with the kind of the object of droplet ejection.

Further, an organoelectronic device according to the invention can be fabricated by the method of fabricating an organoelectronic device described above.

According to the invention, by depositing a desired organic matter by a liquid phase process and depositing a desired metal by a vapor phase process, a stable organometallic complex layer can be formed in the junction interface between the organic matter and the metal. Therefore, if an unstable organic material is used, the problem of decomposition or loss of function of the organic material caused by an influence of heat applied during the film forming process is no more occurs. Further, in a laminated structure, no influence is exerted to a junction surface of each layer. Accordingly, organometallic compounds can stably be formed as a film, thus increasing the bonding force of the junction interface. Further, since the complex layer is formed only in the junction interface, a very thin film of, for example, one molecule thick can be formed.

Further, an electronic apparatus according to the invention is equipped with the organoelectronic device described above. Thus, an electronic apparatus which can enjoy a long life and obtain a blight display can be provided.

Further, a method of fabricating an organic EL device can include the step of forming a blue light emitting layer, a green light emitting layer, and a red light emitting layer. The step of forming a first electron injection layer on the blue light emitting layer, and the step of forming a second electron injection layer and a third electron injection layer respectively on the green light emitting layer and the red light emitting layer. The step of forming a second electron injection layer and a third electron injection layer can include the step of forming an organic matter by a liquid phase process and the step of forming metal by a vapor phase process, and the second electron injection layer and the third electron injection layer comprise an organometallic compound comprising the organic matter and the metal.

In this case, to realize full color display by the organic EL device, as organic light emitting layers having mutually different colors, the blue, green, and red light emitting layers are disposed in a plane on the substrate. However, if the plural light emitting layers are provided, the most suitable complex material may be different with respect to each of the light emitting layers. Therefore, if the structure described above is adopted, the most suitable complex is preferably selected in accordance with each of the light emitting layers, and a number of kinds of selected complex are preferably included in a mixed manner in the electron injection layer. By making all of the most suitable complexes for respective light emitting layers be included in the electron injection layer, the electron injection layer which provides an excellent electron injection effect for every light emitting element can be formed. Further, color balance can be adjusted by alter the mixing ratio of each complex. In other words, it is possible that the electron injection layers are respectively provided for the light emitting layers, and each of the electron injection layers provided for the respective light emitting layers includes only the complex selected for the corresponding light emitting layer. By thus configuration, materials can be designed to be best suitable for each of the light emitting layers, and color balance of each light emitting layer can easily be adjusted.

Therefore, according to the invention, since the organometallic compound formed by depositing desired organic matter by a liquid phase process, and by depositing desired metal by a vapor phase process, becomes the second electron injection layer and the third electron injection layer, a stable organometallic complex layer can be formed in the junction interface between the organic matter and the metal. Therefore, if an unstable organic material is used, the problem of decomposition or loss of function of the organic material caused by an influence of heat applied during the film forming process is no more occurs. Further, in a laminated structure, no influence is exerted to a junction surface of each layer. Accordingly, organometallic compounds can stably be formed as a film, thus increasing the bonding force of the junction interface. Further, since the complex layer is formed only in the junction interface, a very thin film of, for example, one molecule thick can be formed. Accordingly, since the light emission efficiency of each of blue, green, and red light emitting layers is improved, the colored light emission with high contrast and good depth can be realized.

Further, in the method of fabricating an organic EL device according to the invention, the organometallic compound can be preferably an organometallic complex, and the central atom of the organometallic complex preferably comprises the same metallic element as at least one of composing elements of the electrode, and further, the organometallic complex is preferably a β-diketone complex. Here, organometallic complexes having various structures such as chelate complexes or crown ether complexes can be used. Among the above, complexes having the â-diketone based ligand (â-diketone complexes) are preferable because they are acidity reagents and multidentate ligands with oxygen to form stable metallic complexes.

Further, by using the same element for the central atom of the complex as at least one of the element composing the second cathode or the third cathode, the bonding force of the interfacial surface therebetween can be further increased to provide a further enhanced electron injection effect. In this case, it is sufficient that the complex takes the composing element of the cathode adjacent to the interfacial surface as its center atom, and if, for example, the cathode is formed of a plurality of thin films laminated with each other, it is enough that the center atom of the complex is the same as the composing element of the thin film disposed nearest to the electron injection layer out of the layers.

Further, in the method of fabricating an organic EL device according to the invention a thin film of an organometallic compound is preferably formed by forming an organic matter and then forming metal on the organic matter in the step of forming a second electron injection layer and a third electron injection layer. Thus, the organometallic compound thin film, namely the second electron injection layer and the third electron injection layer can be formed in accordance with the previously formed organic matter. Further, if an inkjet method (a droplet discharge method) is used as a liquid phase process for forming an organic matter, the organic matter can be formed in a predetermined pattern, and accordingly, the thin film of the organometallic compound can selectively be formed to form the second electron injection layer and the third electron injection layer having a predetermined pattern.

Further, in the method of fabricating an organic EL device according to the invention a thin film of an organometallic compound is preferably formed by forming metal and then forming an organic matter on the metal in the step of forming a second electron injection layer and a third electron injection layer. Thus, the organometallic compound thin film can be formed in accordance with the previously formed metal. Further, if an ink-jet method is used as a liquid phase process for forming an organic matter, the organic matter can be formed in a predetermined pattern, and accordingly, the thin film of the organometallic compound can selectively be formed to form the second electron injection layer and the third electron injection layer having a predetermined pattern.

Further, in the method of fabricating an organic EL device according to the invention, the liquid phase process can be preferably a droplet discharge method. Thus, the first electron injection layer, the second electron layer, and the third electron injection layer can selectively be formed by a droplet discharge method.

Accordingly, a first electron transfer layer can selectively be formed only on the light emitting layer for emitting a blue beam, a second electron transfer layer can selectively be formed only on the light emitting layer for emitting a green beam, and a third electron transfer layer can selectively be formed only on the light emitting layer for emitting a red beam.

Further, an organic EL device according to the invention can be fabricated by the method of fabricating an organic EL device described above.

According to the invention, since the organometallic compound formed by depositing desired organic matter by a liquid phase process, and by depositing desired metal by a vapor phase process, becomes the second electron injection layer and the third electron injection layer, a stable organometallic complex layer can be formed in the junction interface between the organic matter and the metal. Therefore, if an unstable organic material is used, the problem of decomposition or loss of function of the organic material caused by an influence of heat applied during the film forming process is no more occurs. Further, in a laminated structure, no influence is exerted to a junction surface of each layer. Accordingly, organometallic compounds can stably be formed as a film, thus increasing the bonding force of the junction interface. Further, since the complex layer is formed only in the junction interface, a very thin film of, for example, one molecule thick can be formed. Accordingly, since the light emission efficiency of each of blue, green, and red light emitting layers is improved, the colored light emission with high contrast and good depth can be realized.

Further, an electronic apparatus according to the invention is equipped with the organic EL device described above. Thus, an electronic apparatus capable of providing display, in which the colored light emission with high contrast and good depth can be realized, can be provided.

Further, an organoelectronic device according to the invention can be equipped with the organometallic compound thin film described above. Therefore, the same advantages as described are obtained.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Hereinafter, an organic EL device according to an exemplary embodiment of the invention is described.

Figure 1:
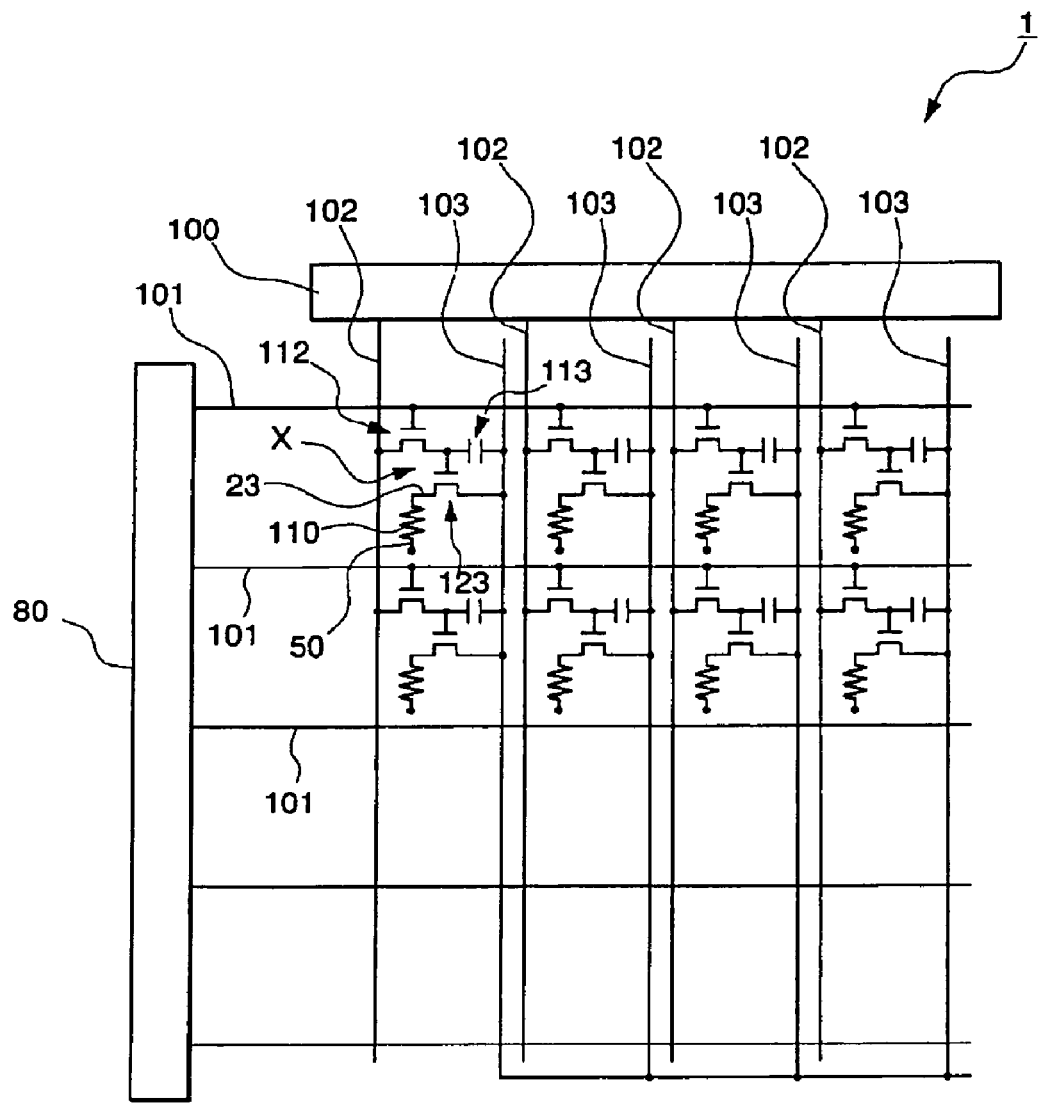
FIG. 1 is a schematic view showing a wiring structure of an organic EL device according to the invention.

FIG. 1 is a view schematically showing an interconnection structure of the organic EL device according to the embodiment. The organic EL device 1 is an active matrix type of display device using thin film transistors (hereinafter abbreviated as TFT) as switching elements.

The organic EL device (an organoelectronic device equipment) 1 has, as shown in FIG. 1, a structure in which a plurality of scanning lines 101, a plurality of data lines 102 each extending in a direction traversing the respective scanning lines 101 with the right angle, and a plurality of power supply lines 103 each extending in parallel to the respective data lines 102 are disposed, wherein a pixel area X is provided in each of intersections of the plurality of scanning lines 101 with the plurality of data lines 102.

A data line driver circuit 100 equipped with a shift register, a level shifter, a video line, and an analog switch is connected to the data lines 102. Further, a scanning line driver circuit 80 equipped with a shift register and a level shifter is connected to the scanning lines 101.

Furthermore, in each pixel area X, there are provided a switching TFT 112 to which a scanning signal is supplied at its gate electrode via the scanning lines 101, a hold capacitor 113 for holding a pixel signal supplied from the data lines 102 via the switching TFT 112, a drive TFT 123 to which the pixel signal held by the hold capacitor 113 is supplied at its gate electrode, a pixel electrode (anode) 23 to which a drive current flows from the power supply lines 103 when electrically connected to the power supply lines via the switching TFT 112, and a functional layer 110 sandwiched between the pixel electrode 23 and a cathode 50. The pixel electrode 23, the cathode 50, and the functional layer 110 form a light emitting element (organic EL element).

According to the organic EL device 1, when the scanning lines 101 is driven to turn on the switching TFT 112, the current potential of the data line 102 is held by the hold capacitor 113, and the on/off state of the drive TFT 123 is determined in accordance with the state of the hold capacitor 113. Then, a current flows from the power supply line 103 to the pixel electrode 23 via the channel of the drive TFT 123, and further to the cathode 50 via the functional layer 110. The functional layer emits light in accordance with the current flowing therethrough.

Hereinafter, a specific structure of the organic EL device 1 according to the exemplary embodiment is described with reference to FIGS. 2 through 5.

Figure 2:
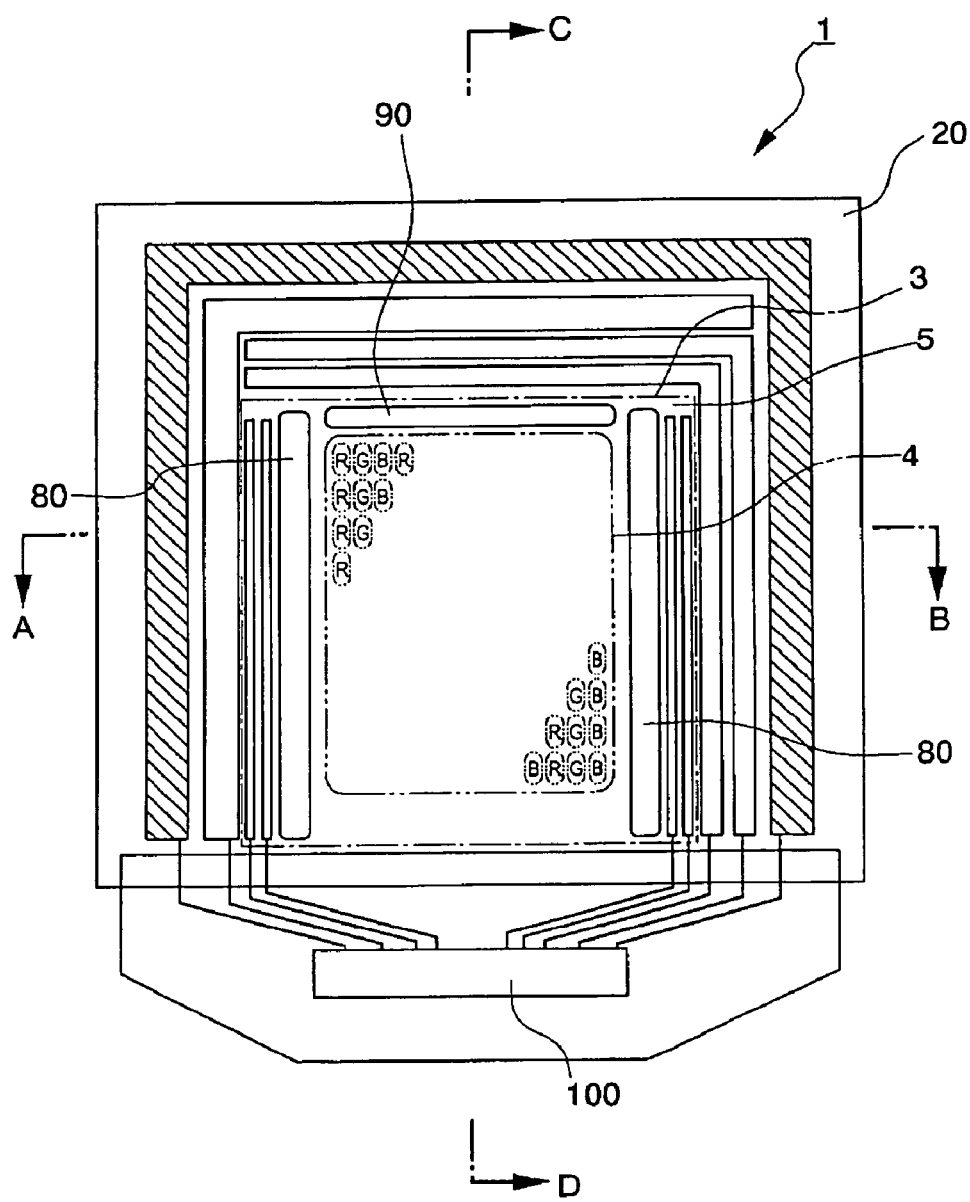
FIG. 2 is a plan view schematically showing a configuration of an organic EL device according to the invention.

Firstly, referring to FIG. 2, a planar structure of the organic EL device according to the embodiment is explained.

The organic EL device 1 of the embodiment can include a substrate having an electrically insulating property, a pixel electrode region (not shown in the drawings) having the pixel electrodes connected to the switching TFT (not shown in the drawings) and disposed on the substrate 20 in a matrix, the power supply lines (not shown in the drawings) disposed in the periphery of the pixel electrode region and connected to each of the pixel electrodes, and a pixel section 3 (inside the chain dashed line shown in FIG. 2) shaped nearly rectangular in plan view and disposed at least on the pixel electrode region. Note that in the invention, a substance which includes the substrate 20, various circuits formed thereon, such as a switching TFT, and an interlayer insulating film is referred to as a base body. (denoted by reference numeral 200 in FIGS. 3 and 4).

The pixel section 3 is zoned into an actual display region 4 (inside the chain double dashed lines shown in FIG. 2) located in a center area thereof and a dummy region 5 (a region between the chain dashed lines and the chain double dashed lines) disposed around the actual display region 4.

In the actual display region 4, display areas R, G, B each including the pixel electrode are disposed in a matrix spaced in both A-B and C-D directions.

Further, in both sides of the actual display region 4 in FIG. 2, there are provided scanning line driver circuits 80, 80. These scanning line driver circuits 80, 80 are disposed beneath the dummy region 5.

Further, above the actual display region 4 in FIG. 2, there is disposed a testing circuit 90. The testing circuit 90 is a circuit for examining the operating condition of the organic EL device 1, and is equipped with, for example, an examination data output means (not shown in the drawings) for outputting the examination results to the outside to allow examination of quality or defects of display devices while manufacturing or when shipping. Note that the examination circuit 90 is also disposed beneath the dummy region 5.

Figure 3:
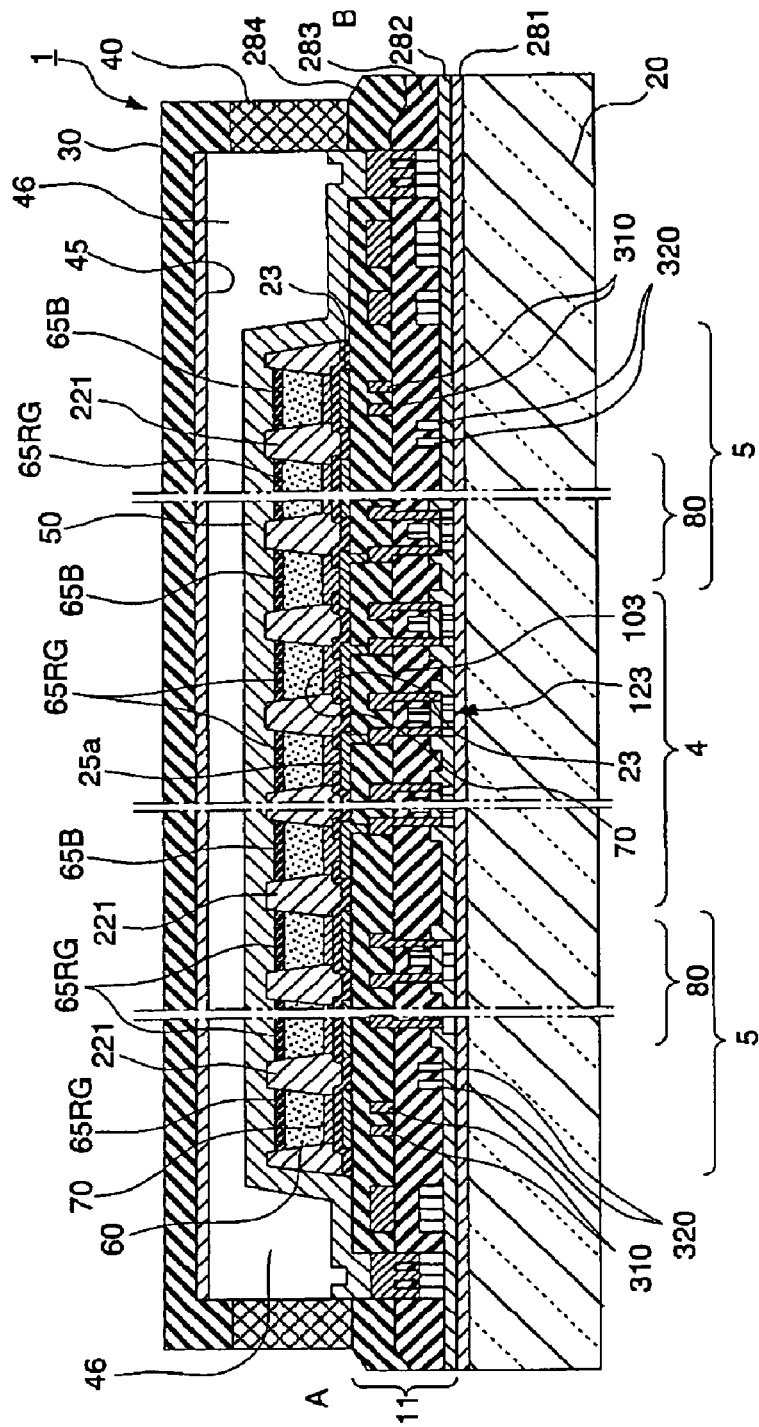
FIG. 3 is a cross-sectional view along the A-B line shown in FIG. 2.
Figure 4:
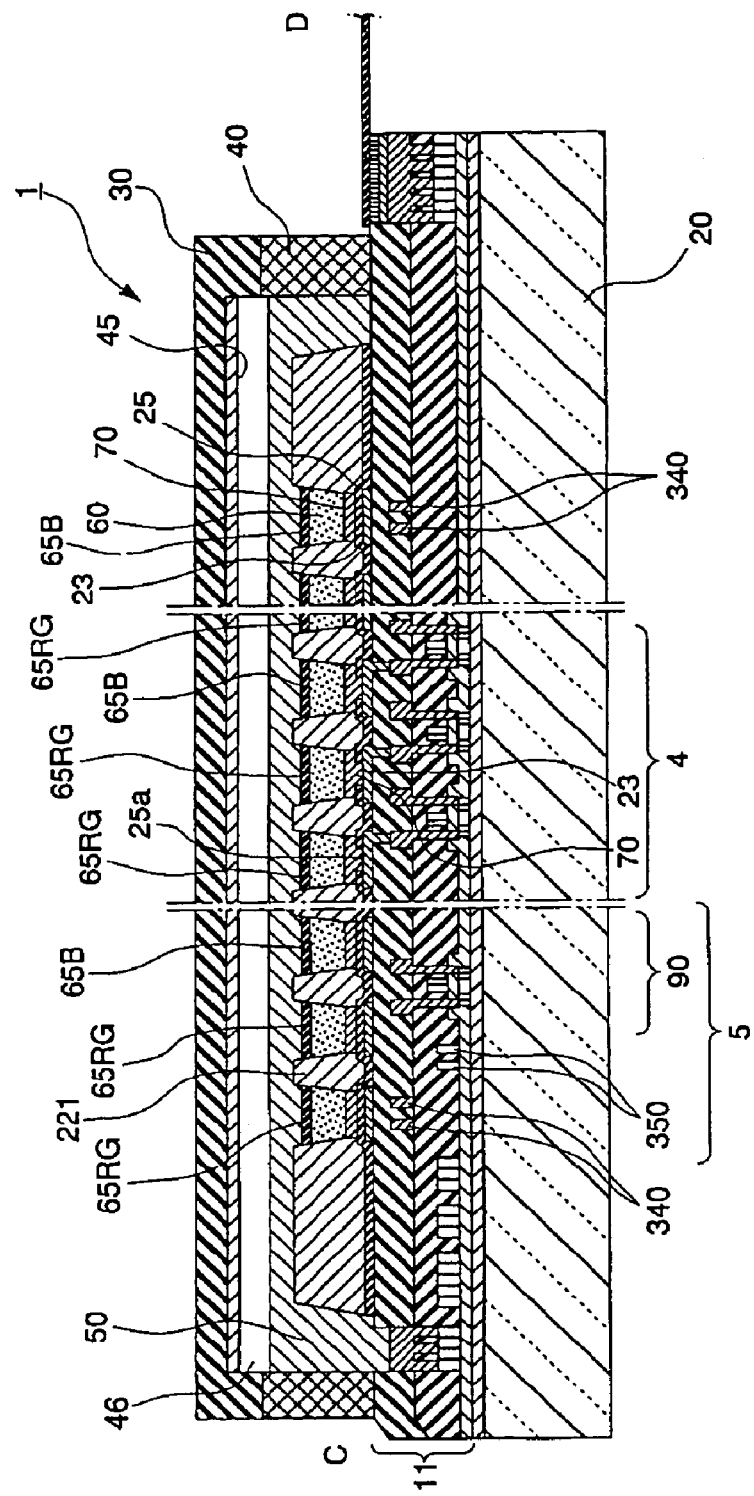
FIG. 4 is a cross-sectional view along the C-D line shown in FIG. 2.

To the scanning line driver circuits 80 and the examination circuit 90, their drive voltages are applied from a predetermined power source section via a drive voltage conducting section 310 (See FIG. 3.) and a drive voltage conducting section 340 (See FIG. 4.). Further, drive control signals and drive voltages for the scanning driver circuits 80 and the examination circuit 90 are supplied or applied from a predetermined main driver or the like for controlling the operation of the organic EL device 1 via a drive signal conducting section 320 (See FIG. 3.) and a drive voltage conducting section 350 (See FIG. 4.). Note that the drive control signals in this case are command signals issued by the main driver or the like in relation to the control of the scanning line driver circuits 80 and examination circuit 90 issuing the signals.

Figure 5:
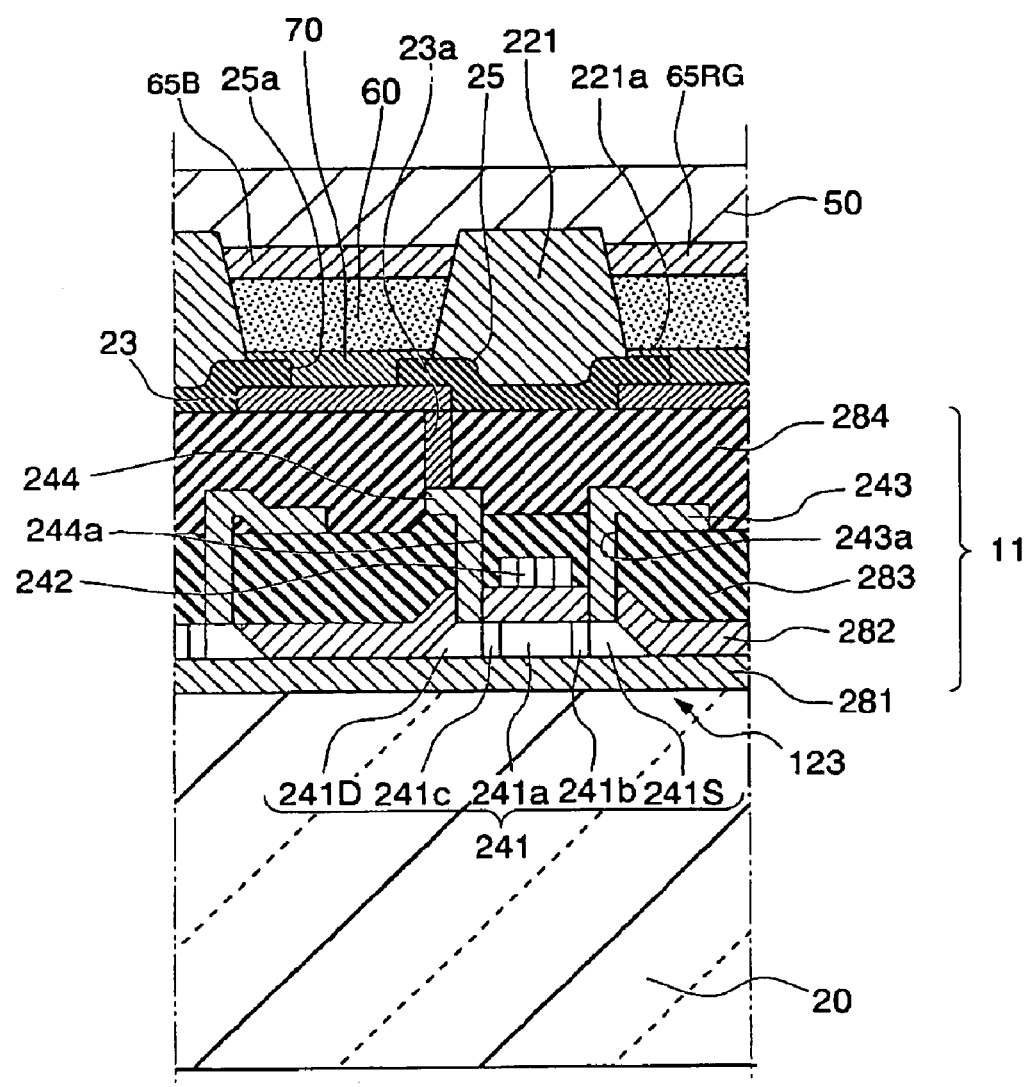
FIG. 5 is a cross-sectional view showing a relevant part of FIG. 3 enlarged.

Hereinafter, a cross-sectional structure of the present organic EL device is described referring to FIGS. 3 through 5. FIGS. 3 and 4 are cross-sectional views along the A-B line shown in FIG. 2, and FIG. 5 shows an enlarged view of a characterizing part thereof.

The present organic EL device 1 is formed of the substrate 20 and a sealing substrate 30 bonded to each other via sealing resin 40 in between.

Since so called bottom-emission type of organic EL devices have structures in which the emitted light is taken out from the substrate 20 side, transparent or translucent materials are adopted as the substrate 20. For example, glass, quartz, resin (plastics, plastic films), and so forth can be cited as such materials, and in particular, soda glass which is inexpensive is preferably used.

In contrast, in case of a top-emission type of organic EL devices, since the structures are taken in which the emitted light is taken out from the sealing substrate 30 side opposite substrate 20, either of transparent substrates or opaque substrates can be used as the substrate 20. As a material of the opaque substrate, for example, thermoset resin, thermoplastic resin, and so on can be cited in addition to ceramics such as alumina, or metal sheets such as stainless sheets with insulating treatment such as surface oxidization.

As the sealing substrate 30, for example, plate like members having electrically insulating property can be adopted. In particular, in case of top-emission type, transparent substrates such as glass substrates, quartz substrates, resin substrates, can be adopted as the sealing substrate 30. Further, a sealing resin 40 is made, for example, of thermoset resin or ultraviolet curing resin, and in particular, preferably of epoxy resin which is a kind of thermoset resin.

Further, above the substrate 20, there can be formed a circuit section 11 including the drive TFT 123 for driving the pixel electrode 23, and so on, on which the light emitting element is provided. The light emitting element is formed of the pixel electrode 23, the functional layer 110 composed mainly of the light emitting layer 60, and the cathode 50 all stacked in this order.

The pixel electrode 23 functions as an anode for supplying positive holes to the light emitting layer 60, and is made of, for example, in case of the bottom-emission type, transparent conductive materials, such as ITO (indium tin oxide), indium oxide-zinc oxide amorphous transparent conductive film (Indium Zinc Oxide: IZO (registered trade mark)) (proposed by Idemitsu Kosan Co. Ltd.) can be used. Further, in case of the top-emission type, not only such a transparent conductive material but also a light reflecting or opaque conductive material, such as aluminum (Al) or silver (Ag) can be utilized.

As the light emitting layer, known luminescence materials capable of generating fluorescence or phosphorescence can be used. Specifically, (poly)fluorene derivatives (PF), (poly) para-phenylenevinylene derivatives (PPV), polyphenylene derivatives (PP), poly-para-phenylene derivatives (PPP), polyvinylcarbazole (PVK), polythiophene derivatives, poly-dialkylfluorene (PDAF), polyfluorenebenzothiadiazole (PFBT), polyalkylthiophene (PAT), or polysilane-based materials such as polymethylphenylsilane (PMPS) can preferably be used.

Further, the above polymeric materials can be used with polymeric materials such as perylene dye, coumarin dye, or rhodamine dye, or with small molecular materials such as rubrene, perylene, 9,10-diphenylanthracene, tetraphenyl butadiene, nile red, coumarin 6, or quinacridone doped thereto.

Note that polymer denotes polymerized substance having a larger molecular weight than so-called small molecular having a molecular weight of about few hundreds, and the polymeric materials mentioned above include, in addition to generally-called polymers which are polymerized substances having molecular weights of no less than 10000, oligomeric substances called oligomer having molecular weights of no larger than 10000.

In the exemplary embodiment, light emitting layers respectively corresponding to R (red), G (green), and B (blue) are disposed in a plane for each pixel to realize full-color display.

Further, in the exemplary embodiment, a hole injection/transfer layer 70 (See FIG. 5.) can be provided between the pixel electrode 23 and the light emitting layer 60 as required. By providing the hole injection/transfer layer, electrons moving through the light emitting layer 60 can effectively be blocked to increase probability of recombining electrons with holes inside the light emitting layer. As the hole injection/transfer layer 70, materials having low injection barrier with the pixel electrode 23 and high hole mobility are preferably used. As such materials, for example, polythiophene derivatives, polypyrrole derivatives, or materials derived from doping these materials can be used. Specifically, dispersion liquid of 3,4-polyethelenedioxithiophene/polystyrene-sulfonic-acid (PEDOT/PSS) (Product mane: Bytron-p, produced by Bayer MaterialScience AG), which is dispersion liquid made by dispersing 3,4-polyethelenedioxithiophene in polystyrene-sulfonic-acid and then further dispersed in water, is used, for example.

The cathode 50 has, as shown in FIGS. 3 through 5, the larger area than the total area of the actual display region 4 and the dummy region 5, and is formed so as to cover these regions. As the cathode 50, for example, in case of top-emission type, transparent conductive materials are used. As such transparent conductive materials, co-deposition film of bathocuproine (BCP) and cesium (Cs) can preferably be used. In this case, in order to provide further conductivity, a structure having an ITO layer stacked thereon is preferably adopted. Note that, instead of the co-deposition film of BCP and Cs, very thin film (e.g., a thin film having thickness of about 5 nm) of Ca can be formed with ITO layer stacked thereon. Further, in case of the top-emission type, not only such a transparent conductive material, but also a light reflecting or opaque conductive material, such as Al can also be used.

In this case, in order to increase electron injection efficiency, the cathode preferably includes a metallic element (e.g., alkaline metals, alkaline-earth metals, magnesium, rare-earth elements (except Pm)) with low work function as a composing element. Note that such metallic elements are enough to present on the interfacial surface with the light emitting layer 60, and if, for example, the cathode is formed of a plurality of films laminated with each other, it is enough that only the nearest film to the light emitting layer 60 is composed of the low work function metal element described above. Specifically, by forming Ca film of about 20 nm and then forming Al film of about 200 nm thereon, a cathode with high electron injection efficiency can be obtained. In this case, Al film has an additional function of a reflecting layer for emitting generated light from a side of the substrate 20.

Further, in the exemplary embodiment, in order for increasing efficiency of injecting electron from the cathode 50 to the light emitting layer 60, between the cathode 50 and the light emitting layer 60, there are formed electron injection layers (charge transfer layers) 65B, 65RG for injecting and transferring electron for each of light emitting layers 60 respectively emitting red (R), green (G), and blue (B) beams, wherein the electron injection layer 65B is formed for the light emitting layer 60 emitting blue (B) beam, and the electron injection layer 65RG is formed for the light emitting layers 60 respectively emitting red (R) and green (G) beams.

The electron injection layer 65B is made of LiF (lithium fluoride). Note that other compounds than LiF can be used, and preferably, compounds such as oxides, fluorides, or chlorides including one of metallic elements selected from 1A or 2A group of the periodic table or rare-earth elements, for example, Li, Na, K, Rb, Cs, Mg, Ca, Sr, Ba, La, Ce, Pr, Nd, Pm, Sm, Eu, Gd, Tb, Dy, Ho, Er, Tm, Yb, Lu.

Further, the electron injection layer 65RG can be made of an organometallic complex which is an organometallic compound expressed by a following general equation where M denotes a central atom, A denotes a chelate ligand made of an organic material, and B denotes a neutral ligand. $MA_nB_m$ (n: the balance of the central atom, m: a natural number) As such a metallic complex, complexes of various structures such as chelate complexes or crown ether complexes can be used.

Specifically, as the chelate ligand A, β-diketone based ligands, such as acetylacetone (acac), dipivaloylmethane (dpm), hexafluoroacetylacetone (hfa), 2,2,6,6,-tetramethyl-3,5-octanedioacetone (TMOD), thenoyltrifluoroacetone (TTA), or 1-phenyl-3-isohepti-1,3-propanedione (Product name: LIX54, LIX51, produced by Henkel KGaA), quinolinol based ligends such as 8-quinolinol (oxine), 2-methil-8-quinolinol, phosphoric acid based ligands such as trioctylhofphineoxide (TOPO), tributyl phosphate (TBP), isobutyl methyl ketone (MBK), or bis(2-ethylhexyl)phosphoric acid (D2EHPA), carboxylic acid based ligands such as acetic acid or benzoic acid, or diphenylthiocarbazone ligand can preferably be used.

Among the above, complexes having the β-diketone based ligand (β-diketone complexes) are preferable because they are acidity reagents and multidentate ligands with oxygen to form stable metallic complexes.

Further, as the neutral ligands, heterocyclicamine, pyridine (py), or the like such as 2,2'-bipyridine (bpy), 1,10-phenanthroline (phen), 2,9-dimethyl-1,10-phenanthroline (dmp), bathophenanthroline (b-phen), bathocuproine (bcp) can preferably be used.

Note that, in the electron injection layer 65RG, in order to increase the bonding force of the electron injection layer 65RG and the cathode 50, the center atom M can be composed of the same metallic element as the metallic element forming the cathode 50. In this case, it is sufficient that the center atom M is the same as the composing element of the cathode which is located near the interfacial surface with the electron injection layer 65RG, and if the cathode is formed of a plurality of thin films laminated with each other, it is enough that the center atom M is the same as the composing element of the thin film disposed nearest to the electron injection layer out of the layers. Specifically, if the cathode 50 is formed of a single layer film of Al, $Al(acac)_2$ having the same metallic element in the center atom is used as the complex mentioned above. Further, if the cathode 50 is formed of a laminated film of Ca and Al, $Ca(acac)_2$ or the like having Ca, which is disposed nearer to the electron injection layer, as the center atom, if a co-deposition film of BCP and Cs is used as the cathode 50, Cs(acac) or the like is used for the complex mentioned above.

Note that, if the cathode 50 is composed of a certain metallic element with low work function, the center atom M of the complex is to be composed of a metallic element such as alkali metal, alkali-earth metal, magnesium, rare-earth elements, since such complexes have high electron affinity and small electron injection barriers, the light emission efficiency is further enhanced.

As described above, in the exemplary embodiment, suitable materials to the respective light emitting layers are mixed in the electron injection layer. In other words, if a plurality of kinds of light emitting layers, R, G, and B are provided in each pixel, as is the case with the exemplary embodiment, the most suitable material for each light emitting layer, for example, LiF for the electron injection layer 65B, an organometallic complex for the electron injection layer 65RG, is formed. As described above, by mixing the suitable organometallic complexes to the respective light emitting layer in the corresponding electron injection layers 65B, 65RG to compensate functions among each other, the light emitting efficiency can further be enhanced. Note that, although LiF is adopted as the electron injection layer 65B, a complex having Li as the center metal can also be adopted.

Alternatively, it is possible to select the most suitable material and metallic complex for each light emitting layer and to selectively provide it to the corresponding light emitting layer. In other words, it is possible that the electron injection layers are respectively provided for the light emitting layers, and each of the electron injection layers provided for the respective light emitting layers includes only the complex selected for the corresponding light emitting layer. By this configuration, materials are designed to be best suitable for each of the light emitting layers. Further, in this case, color balance of each light emitting layer can easily be adjusted.

Still further, the organometallic complexes can be used alone or also mixedly with conventional materials having electron transferring properties. As such known electron transferring materials, cyclopentadiene derivatives, oxadiazole derivatives, bisstyrylbenzene derivatives, p-phenylene compounds, phenantroline derivatives, and triazole derivatives can be cited. Further, the thickness of the electron injection layer 65RG is preferably 0.1 nm through 1.0 nm for ensuring necessary conductivity.

Hereinafter, a configuration of the circuit section for driving the light emitting elements is described referring to FIG. 5.

Under the light emitting elements, there is provided circuit section 11, as shown in FIG. 5. The circuit section 11 is formed on the substrate 20 to compose the base body 200. Namely, a priming protective layer 281 consisting mainly of $SiO_2$ is formed on a surface of the substrate 20 as a priming, above which a silicon layer 241 is formed. On a surface of the silicon layer 241, there is formed a gate insulation layer 282 consisting mainly of $SiO_2$ or SiN.

Further, an area of the silicon layer 241 overlapping a gate electrode 242 across the gate insulation layer 282 is defined as channel region 241a. Note that the gate electrode 242 is a part of the scanning line 101 not shown in the Figure. Meanwhile, on the surface of the gate insulation layer 282 which covers the silicon layer 241 and has the gate electrode 242 formed thereon, there is formed a first interlayer insulation layer 282 consisting mainly of $SiO_2$.

Further, in the silicon layer 241, adjacent to the source side of the channel region 241a, there are provided a low-concentration source region 241b and a high-concentration source region 241S, and adjacent to the drain side of the channel region 241a, there are provided low-concentration drain region 241c and high-concentration drain region 241D, which makes a so-called LDD (Lightly Doped Drain) structure. Out of these elements, the high-concentration source region 241S is connected to a source electrode 243 via a contact hole 243a which opens through the gate insulation layer 282 and the first interlayer insulation layer 283. The source electrode 243 is formed as a part of the power supply lines 103 (See FIG. 1. In FIG. 5, it is located at the source electrode 243 and extends in a direction perpendicular to the sheet.). Meanwhile, the high-concentration drain region 241D is connected to a drain electrode 244 consisting of the same layer as the source electrode 243 via a contact hole 244a which opens through the gate insulation layer 282 and the first interlayer insulation layer 283.

The upper surface of the first interlayer insulation layer 283, on which the source electrode 243 and the drain electrode 244 are formed, is covered with a second interlayer insulation layer 284 consisting mainly of, for example, an acrylic resin component. As the second interlayer insulation layer 284, other materials than the acrylic insulation films, for example, silicic compounds such as SiN or $SiO_2$ can be used as well. As described above, if silicic compounds having high gas barrier properties, particularly silicic nitrogen compounds are used as the second interlayer insulation layer 282, oxygen or water can be prevented from entering into the light emitting layer 60 from the substrate side even with the substrate 20 made of resin having high moisture permeability to lengthen the life of the light emitting elements.

And, on the surface of the second interlayer insulation layer 284, there is formed the pixel electrode 23 made of ITO, which is connected to the drain electrode 244 via a contact hole 23a provided through the second interlayer insulation layer 284. Namely, the pixel electrode 23 is connected to the high-concentration drain region 241D of the silicon layer 241 via the drain electrode 244.

Note that TFT (TFT for driver circuits) included in the scanning line driver circuit 80 and the examination circuit 90, that is, for example, N-channel type or P-channel type of TFT forming inverters included in shift registers of such circuits have substantially the same structure as the driver TFT 123 described above except that they are not connected to the pixel electrodes 23.

On the surface of the second interlayer insulation layer 284, where the pixel electrodes 23 are formed, there is provided, in addition to the pixel electrodes 23, a bank structure comprising the lyophilicity control layer 25 described above and an organic bank layer 221. The lyophilicity control layer 25 consists mainly of a lyophilic material such as, for example, $SiO2$, and the organic bank layer 221 is made of, for example, acrylic or polyimide. And, above the pixel electrode 23 and inside an opening 25a provided in the lyophilicity control layer 25 and inside an opening 221a defined by the organic bank 221, there are stacked the hole injection/transfer layer 70 and the light emitting layer 60 in this order. Note that the word lyophilic subject to the lyophilicity control layer 25 of the exemplary embodiment means that it has relatively higher lyophilicity in comparison to at least the material forming the organic bank layer, i.e., acrylic or polyimide.

The layers up to the second interlayer insulation layer 284 above the substrate 20 as described above form the circuit section 11.

Hereinafter, as an exemplary embodiment of the invention, an example of a fabrication method of the organic EL device 1 described above is described with reference to FIGS. 6 through 9. Note that each of cross-sectional views shown in FIGS. 6 through 9 corresponds to a cross-sectional view along the A-B line shown in FIG. 2.

Firstly, as shown in FIG. 6(a), the priming protective layer 281 is formed on the surface of the substrate 20. And then, after an amorphous silicon layer 501 is formed on the priming protective layer 281 using an ICVD process, a plasma CVD process, or the like, the amorphous silicon layer 501 is turned to be a polysilicon layer by growing crystal grain using a laser annealing process or a rapid thermal process.

Then, as shown in FIG. 6(b), the polysilicon layer is patterned by a photolithography process to form discrete silicon layers 241, 251, and 261. In these discrete silicon layers, the silicon layer 241 is formed inside the display region to compose the driver TFT 123 connected to the pixel electrode 23, and the silicon layers 251 and 261 form P-channel type and N-channel type of TFT (TFT for driver circuit) included in the scanning line driver circuit 80.

Next, the gate insulation layer 282 is formed over the whole of the silicon layers 241, 251, and 261, and the priming protective layer 281 with a silicon oxide film having thickness of about 30 nm to 200 nm using a plasma CVD process, a thermal oxidation method, or the like. Note that, when the gate insulation layer is formed using a thermal oxidation process, crystallization of the silicon layers 241, 251, and 261 can be executed to obtain polysilicon layers.

Further, if channel doping is to be carried out on the silicon layers 241, 251, and 261, for example, boron ion is implanted at this timing with dose amount of about $1\times10^{12}$ $cm^{-2}$. As a result, the silicon layers 241, 251, and 261 become low concentration P-type silicon layers having impurity concentration (estimated based on the impurities remaining after activation annealing) of about $1\times10^{17}$ $cm^{-3}$.

Then, an ion implanting selection mask is formed on a part of channel layers of the P-channel type of TFT and the N-channel type of TFT followed by implanting the phosphorous ion with dose amount of about $1\times10^{15}$ $cm^{-2}$ in this situation. As a result, the high concentration impurities are introduced in a self-aligning manner to the patterning mask, and, as shown in FIG. 6(c), the high concentration source regions 241S and 261S, and the high concentration drain regions 241D and 261D are respectively formed in the silicon layers 241 and 261.

Then, as shown in FIG. 6(c), a conductive layer 502 for forming gate electrodes made of doped silicon or silicide film, or a metal film, such as an aluminum film, a chromium film, or tantalum film is formed over the whole surface of the gate insulation layer 282. The thickness of the conductive layer 502 is about 500 nm. After then, using a patterning method, as shown in FIG. 6(d), a gate electrode 252 for forming the P-channel type of driver circuit TFT, a gate electrode 242 for forming the pixel TFT, and a gate electrode 262 for forming the N-channel type of driver circuit TFT are formed. Further, a drive control signal conducting section 320 (350) and a first layer 121 of a cathode power supply line are also formed at the same time. Note that, in this case, the drive control signal conducting section 320 (350) is disposed in the dummy region 5.

Figure 6:
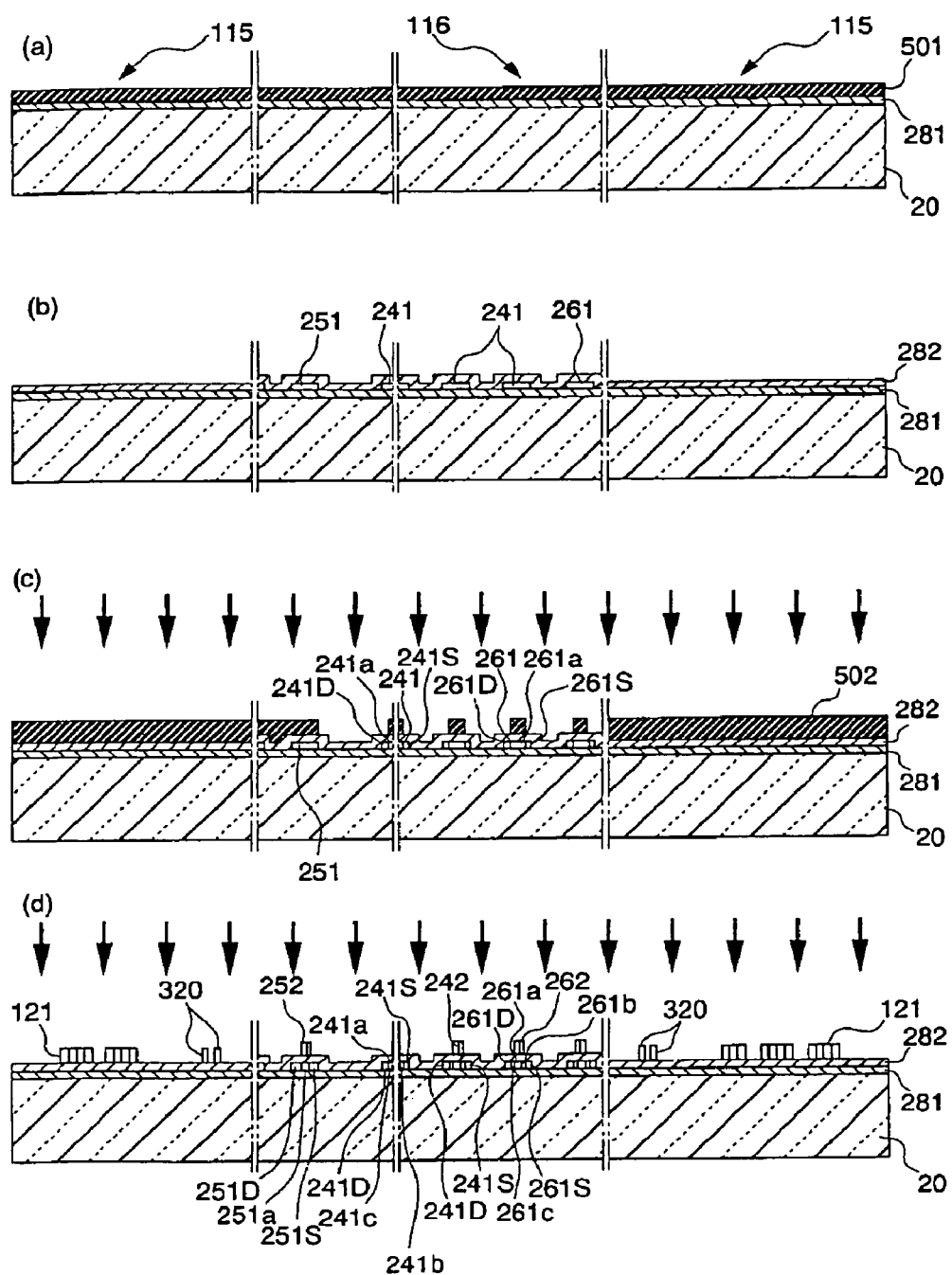
FIG. 6 is a cross-sectional view for explaining a fabrication method of an organic EL device in the order of the process steps.

Subsequently, as shown in FIG. 6($d$), using the gate electrodes 242, 252, and 262 as masks, phosphorous ion is implanted to the silicon layers 241, 251, and 261 with dose amount of about $4\times10^{13}$ cm$^{-2}$. As a result, the low concentration impurities are introduced in a self-aligning manner to the gate electrodes 242, 252, and 262, and, as shown in FIG. 6($d$), the low concentration source regions 241$b$ and 261$b$, and the low concentration drain regions 241$c$ and 261$c$ are respectively formed in the silicon layers 241 and 261. Further, low concentration impurity regions 251S and 251D are formed in the silicon layer 251.

Figure 7:
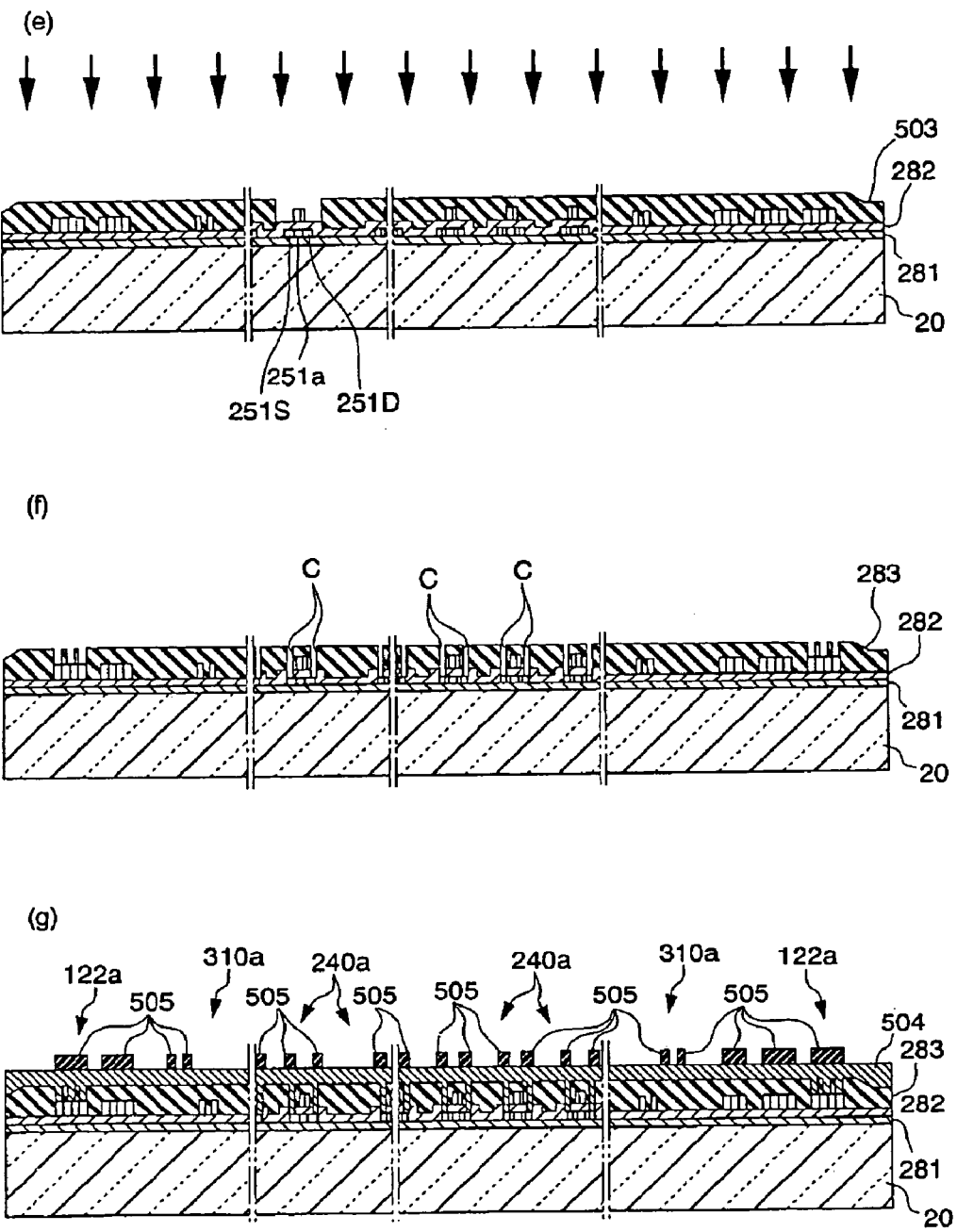
FIG. 7 is a cross-sectional view for explaining the process steps following FIG. 6.

Subsequently, as shown in FIG. 7($e$), an ion implanting selection mask for covering other portion than the P-channel type of driver circuit TFT 252 is formed. Using the ion implanting selection mask 503, boron ion is implanted to the silicon layer 251 with dose amount of about $1.5\times10^{15}$ cm$^{-2}$. As a result, since the gate electrode 252 for forming the P-channel type of driver circuit TFT also functions as the mask, the high concentration impurity can be doped to the silicon layer 251 in a self-aligning manner. Accordingly, the low concentration impurity regions 251S and 251D is counterdoped to become a source region and a drain region of the P-channel type of driver circuit TFT.

And then, as shown in FIG. 7($f$), the first interlayer insulation layer 283 is formed over the entire surface of the substrate 20, and contact holes C are formed at corresponding positions to the source electrode and the drain electrode of each TFT by patterning the first interlayer insulation layer 283 with a photolithography process.

Then, as shown in FIG. 7($g$), the conductive layer 504 made of metal, such as aluminum, chromium, or tantalum is formed so as to cover the first interlayer insulation layer 283. The thickness of the conductive layer 504 is about 200 nm through 800 nm. After then, a patterning mask 505 is formed so as to cover a region 240$a$ where the source electrode and the drain electrode of each TFT are to be formed, a region 310$a$ where the drive voltage conducting section 310 (340) is to be formed, and a region 122$a$ where a second layer of the cathode power supply line, and then the source electrodes 243, 252, and 263, and the drain electrodes 244, 254, and 264 shown in FIG. 8($h$) are formed by patterning the conductive layer 504.

Figure 8:
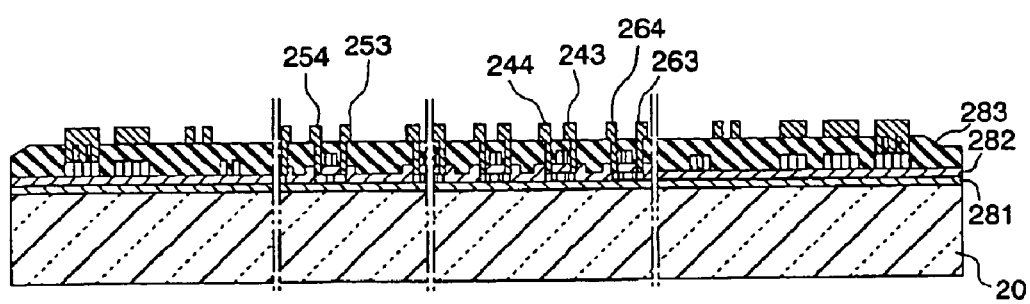
FIG. 8 is a cross-sectional view for explaining the process steps following FIG. 7.
Figure 8:
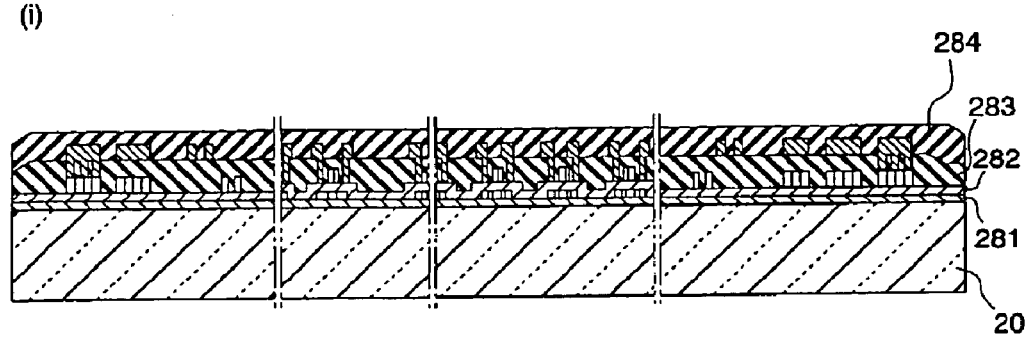
Figure 8:
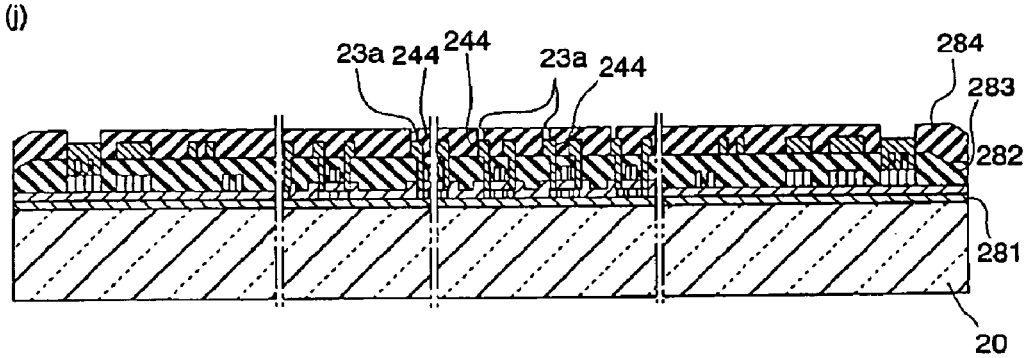

Subsequently, as shown in FIG. 8($i$), the second interlayer insulation layer 284 covering the first interlayer insulation layer 283 having the above element formed thereon is formed using, for example, a polymeric material, such as acrylic resin. The second interlayer insulation layer 284 is preferably formed with thickness of about 1 through 2 μm. Note that the second interlayer insulation layer can be made of SiN or SiO$_2$, wherein the thickness of the SiN film is preferably 200 nm, and the thickness of the SiO$_2$ film is preferably 800 nm.

Then, as shown in FIG. 8($j$), a corresponding portion of the second interlayer insulation layer 284 to the drain electrode 244 of the driver TFT is removed by etching to form a contact hole 23$a$.

Figure 9:
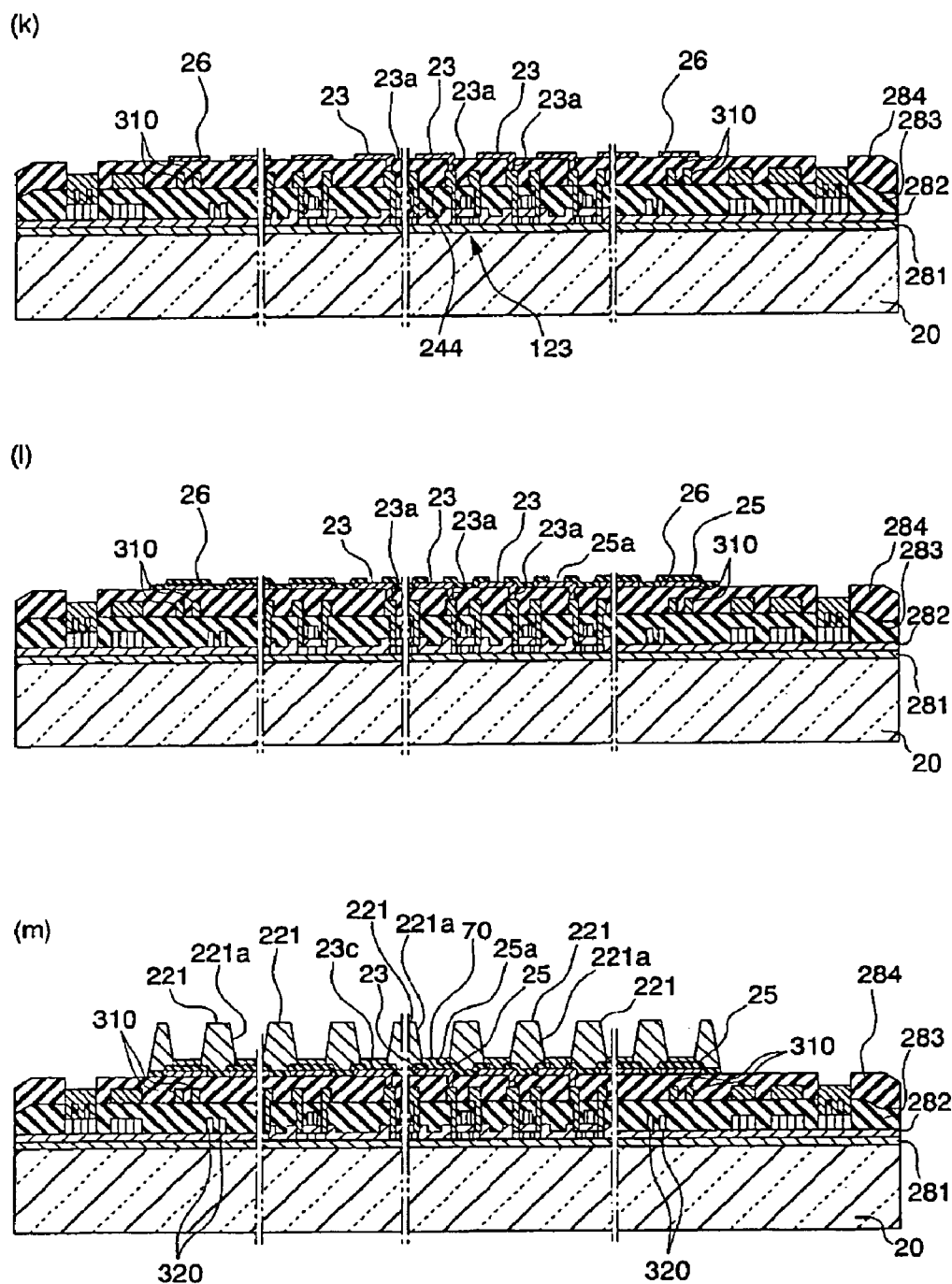
FIG. 9 is a cross-sectional view for explaining the process steps following FIG. 8.

After then, a conductive film for forming the pixel electrode 23 is formed so as to cover the entire surface of the substrate 20. And then, by patterning the transparent conductive film, as shown in FIG. 9($k$), the pixel electrode 23 electrically connected to the drain electrode 244 via contact hole 23$a$ of the second interlayer insulation layer 284 is formed, and, at the same time, a dummy patterns 26 in the dummy region are formed as well. Note that in FIGS. 3 and 4, the name of pixel electrode 23 is used as a generic name of both pixel electrode 23 and dummy pattern 26.

The dummy pattern 26 is structured not to be connected to the metal interconnections in the lower layer passing through the second interlayer insulation layer 284. Namely, the dummy patterns 26 are disposed like islands and have substantially the same shapes as those of the pixel electrodes 23 formed in the actual display region. Of course, it can take a different structure from the shape of the pixel electrode 23 formed in the display region. Note that, in this case, the dummy pattern 26 at least includes what is located above the drive voltage conducting section 310 (340).

Subsequently, as shown in FIG. 9($l$), the lyophilicity control layer 25, which is a insulating layer, is formed on the pixel electrode 23, the dummy pattern 26, and the second interlayer insulation layer. Note that, in the pixel electrode 23, the lyophilicity control layer is formed with an opening corresponding to a part of the pixel electrode 23, and therefore, hole transfer from the pixel electrode 23 is allowed through the opening 25$a$ (See also FIG. 3.). In contrast, in the dummy pattern 26 which is not provided with opening 25$a$, the insulation layer (lyophilicity control layer) 25 functions as a hole transfer blocking layer to prevent holes form moving therethrough.

Subsequently, in the lyophilicity control layer 25, BM (black matrix) is formed in hollow section provided between two different pixel electrodes 23. Specifically, a film of chromium metal is formed on the hollow section of the lyophilicity control layer 25 using a sputtering process.

And then, as shown in FIG. 9($m$), the organic bank layer 221 is formed so as to cover a predetermined position of the lyophilicity control layer 25, specifically the BM. In specific method of forming the organic bank layer, an organic material layer is formed by depositing solution using various deposition processes such as spin coating method or dip coating method, the solution being made by dissolving a resist such as acrylic resin or polyimide resin in a solvent. Note that any materials can be used to form the organic material layer providing that the material does not dissolve in solvent of the ink described below and is easy to be patterned by etching or the like.

Then, opening 221$a$ of the organic bank is formed by simultaneously etching the organic material layer with a photolithography technology or the like to form the organic bank layer 221 having a wall surface in the opening section 221$a$. Note that, in this case, the organic bank layer 221 includes at least what positions above the drive control signal conducting section 320.

Subsequently, an area expressing lyophilicity and an area expressing lyophobicity are formed on a surface of the organic bank layer 221. In the exemplary embodiment, every region is formed by plasma process steps. More specifically, the plasma process steps can include a preheat step, a lyophilicity providing step for making the upper surface of the organic bank layer 221, the wall surface of the opening section 221$a$, the electrode surface 23$c$ of the pixel electrode 23, and the upper surface of the lyophilicity control layer 25 lyophilic, a lyophobicity providing step for making the upper surface of the organic bank layer and the wall surface of the opening section lyophobic, and a cooling step.

That is, a base material (the substrate 20 including bank structure and so forth) is heated to a predetermined temperature, for example, somewhere between 70 and 80 degree, and then, as the lyophilicity providing step, treated by a plasma process (O₂ plasma process) using oxygen as reactive gas in the atmospheric air. Subsequently, as the lyophobicity providing step, a plasma process (CF₄ plasma process) is executed in the atmospheric air using tetrafluoromethane as reactive gas, and then the base material, which has been heated for the plasma process, is cooled to the room temperature, which makes lyophilicity and lyophobicity be provided to the predetermined portions.

Note that, although in the CF₄ plasma process, the electrode surface 23c of the pixel electrode 23 and the lyophilicity control layer 25 are also somewhat influenced, they are kept lyophilic because ITO, the material of the pixel electrode 23, SiO2, TiO2, the material for composing the lyophilicity control layer, or the like has a poor affinity to fluorine, and accordingly, a hydroxyl group provided in the lyophilicity providing step is not substituted with a fluorine group.

Subsequently, a hole injection/transfer layer forming step is executed to form the hole injection/transfer layer 70. In the hole injection/transfer layer forming step, an inkjet method is preferably adopted as a droplet ejection method. In short, using the inkjet method, a hole injection/transfer layer forming material is selectively provided on the electrode surface 23c and then deposited. Subsequently, a drying process and a thermal treatment are executed to form the hole injection/transfer layer 70 on the pixel electrode 23. As the material forming the hole injection/transfer layer 70, for example, solution of PEDOT: PSS with a polar solvent, such as isopropyl alcohol is used.

Note that, in order to form the hole injection/transfer layer 70 by the ink-jet method, firstly the inkjet head (not shown in the drawings) is filled with the hole injection/transfer layer forming material, then an ejection nozzle of the inkjet head is positioned to face the electrode surface 23c positioned in the opening section 25a provided to the lyophilicity control layer 25, and then droplets of which the amount of volume per one droplet is controlled are ejected to the electrode surface 23c. And then the ejected droplets are dried for evaporating dispersion medium or solvent contained in the material to form the hole injection/transfer layer 70.

In this case, the droplets ejected from the ejection nozzle spread on the electrode surface 23c treated to have lyophilicity to fill the opening section 25a of the lyophilicity control layer 25. Meanwhile, on the upper surface of the organic bank layer 221 treated to have lyophobicity, the droplet is repelled and never attached. Accordingly, if the droplet is shifted from a predetermined ejection point and partially provided on the surface of the organic bank layer 221, the surface is not wetted with the droplet, and the repelled droplet is drawn into the opening section 25a of the lyophilicity control layer 25.

Note that, on and after the hole injection/transfer layer forming step, every step is preferably executed under an atmosphere of inactive gas, such as nitrogen or argon to prevent oxidization or moisture absorption of various materials and formed elements.

Figure 10:
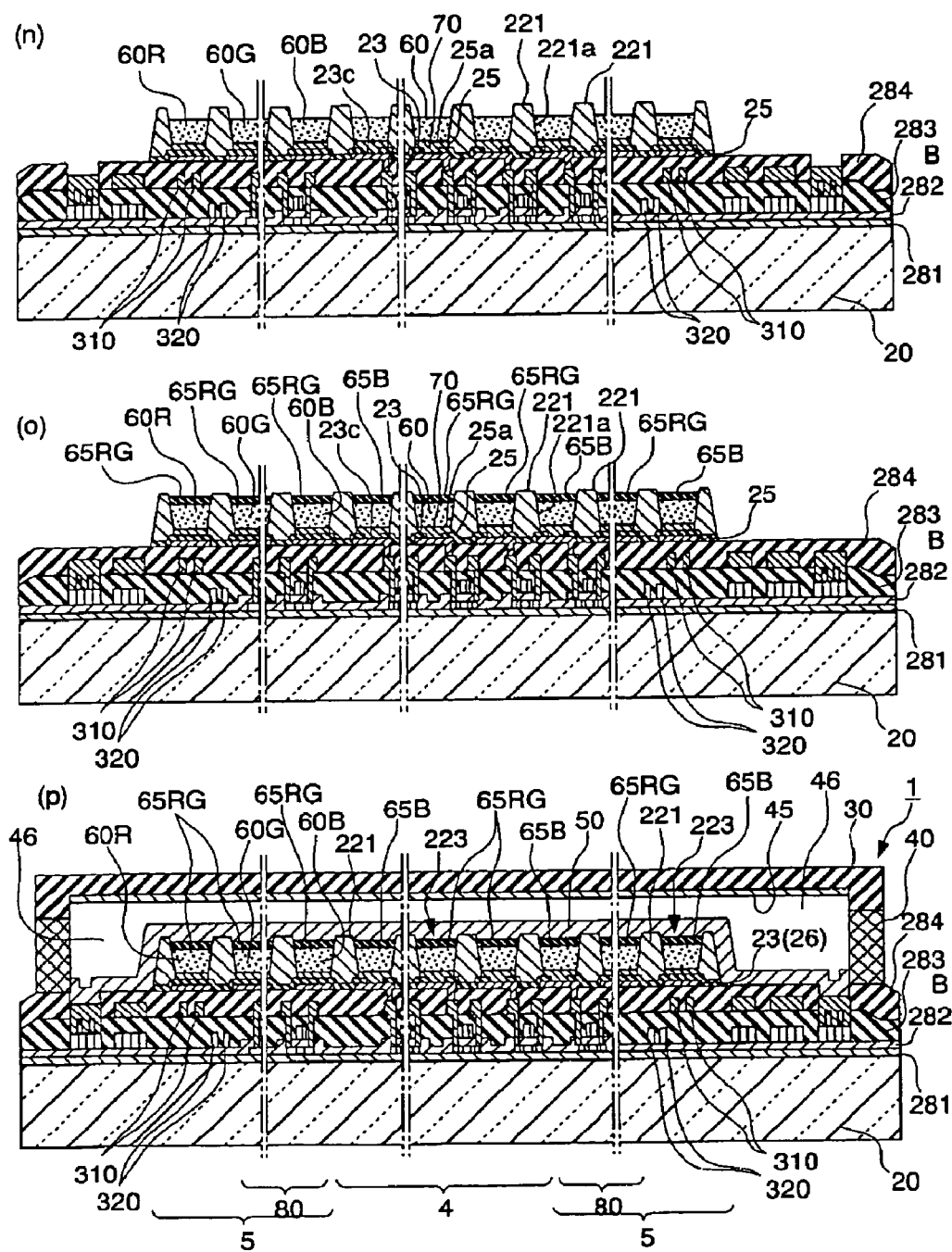
FIG. 10 is a cross-sectional view for explaining the process steps following FIG. 9.

Subsequently, as shown in FIG. 10(n), an organic EL layer forming step is executed to form the organic EL layer 60. In this step, as is the case with forming of the hole injection/transfer layer 70, the inkjet method is preferably adopted as a droplet ejection method. That is, a light emitting layer forming material is ejected on the hole injection/transfer layer 70 using the inkjet method, and then a drying process and a thermal treatment are executed to form the light emitting layer 60 in the opening section 221a provided in the organic bank layer 221, namely on the pixel region. Note that, in the organic EL layer forming step, in order to prevent the hole injection/transfer layer 70 from redissolving, as solvent of the material ink used for forming the organic EL layer, nonpolar solvent which dose not dissolve the hole injection/transfer layer 70. Further, forming of the light emitting layer 60 is carried out with respect to each color.

Then, as shown in FIG. 10(o), an electron injection layer forming step is executed to form the electron injection layer 65B, 65R on the organic EL layer 60.

Here, as the electron injection layer 65B, LiF is deposited by a mask evaporation process or a known liquid phase process.

Further, in the electron injection layer 65RG, acetylacetonate (acac), which is to be a ligand of an organometallic complex, is deposited by a liquid phase process, and further Ca, which is to be a central metal of an organometallic complex, is deposited by a vapor phase process so as to contact the acetylacetonate (acac). As described above, one of the features of the invention is to use both liquid process and vapor process in forming organometallic complexes (organometallic compounds).

In more detail, after depositing acetylacetonate on the light emitting layer 60 using the inkjet method, a thin film of Ca is formed on the entire surface by an evaporation process. According to this, a layer of a stable organometallic complex can be formed in the junction interface between acetylacetonate and Ca. Therefore, if an unstable organic material is used, the problem of decomposition or loss of function of the organic material caused by an influence of heat applied during the film forming process is no more occurs. Further, in a laminated structure, no influence is exerted to a junction interface of each layer. Accordingly, organometallic compounds can stably be formed as a film, thus increasing the bonding force of the junction interface. Further, since the complex layer is formed on only the junction interface, very thin films of, for example, one molecule thick can be formed.

Note that Ca can be deposited on an upper layer of the electron injection layer 65B made of LiF. Since the Ca thin film is a material for forming the cathode 50 described below, if Ca is deposited during the electron injection layer forming step, the Ca thin film is no more necessary to be deposited in the later steps, thus realizing simplification of the process.

Subsequently, as shown in FIG. 10(p), a cathode forming step is executed using an evaporation process to form the cathode 50. In this step, firstly a low work function metal (e.g., Ca) is formed as a film in the entire exposed area of the electron injection layer using an evaporation process or a sputtering process, and then metal (e.g., Al) having higher work function is formed thereon as a film. Thus, the cathode 50 composed of a stacked film of Ca and Al (or ITO) is formed.

And, finally, a sealing step is executed to form the sealing substrate 30. In the sealing step, after inserting desiccating agent 45 inside the sealing substrate 30, the sealing substrate 30 and substrate 20 are adhered with each other by an adhesive 40 to complete the sealing. Note that the sealing step is preferably executed in an atmosphere of inactive gas, such as nitrogen, argon, or helium.

As described above, in the exemplary embodiment, while forming the electron injection layer 65RG, acetylacetonate is formed as a film by a liquid phase process, and further Ca is formed as a film by a vapor phase process, thus stable calcium acetylacetonate Ca(acac)₂ can be formed at the junction interface. Therefore, if an unstable organic material is used, the problem of decomposition or loss of function of the organic material caused by an influence of heat applied during the film forming process is no more occurs. Further, in a laminated structure, no influence is exerted to a junction surface of each layer. Accordingly, organometallic compounds can stably be formed as a film, thus increasing the bonding force of the junction interface. Further, since the complex layer is formed on only the junction interface, very thin films of, for example, one molecule thick can be formed.

Further, since the electron injection layer 65RG, 65B are so formed that the light emission characteristics of the light emitting layer 60 are optimized with respect to each of emitted light colors, R (red) and G (green), and B (blue). Further, by altering the mixture ratio, the color balance can be adjusted. In other words, it is possible that the electron injection layers are respectively provided for the light emitting layers, and each of the electron injection layers provided for the respective light emitting layers includes the complex selected for the corresponding light emitting layer. By this configuration, materials are designed to be best suitable for each of the light emitting layers, and further, color balance of each light emitting layer can easily be adjusted.

Further, in the embodiment, since complexes having the β-diketone based ligand (β-diketone complexes) are adopted, because they are acidity reagents and multidentate ligands with oxygen, stable metallic complexes can be formed.

Further, by composing such complexes to have the same metal in the central atom as composing element of the cathode, namely by adopting Ca as the central atom, the bonding force of the interfacial surface can be increased to enhance the electron injection effect.

Note that, in the above embodiment, although Ca is deposited after acetylacetonate is deposited on the light emitting layer 60 in the step of forming the electron injection layer 65RG, the Ca thin film can be formed in advance, and then acetylacetonate can be deposited thereon. Thus, the same advantages as described above can be obtained, and further, an organic EL device with the reversed structure can be formed. The reverse structure, here, denotes a structure in which the positional relationship of the cathode and the anode is reversed, namely, the substrate 20, cathode 50, electron injection layer 65B, 65RG, light emitting layer 60, hole injection/transfer layer 70, and pixel electrode 23 are stacked from the substrate side in this order. By thus structured, a top-emission type of organic EL device, in which the emitted light is taken out from the pixel electrode 23 side, can be provided. Accordingly, the aperture ratio can be increased to achieve a wider light emission area. Note that, in this case, a transparent material should be adopted as the sealing substrate 30.

Further, in the above exemplary embodiment, although an organic EL device and a fabrication method of the organic EL device, it should be understood that the invention is not limited thereto.

For example, the invention can be applied to a organometallic compound thin film used for photoelectrochemical cells, such as solar cells and a fabrication method therefor.

In forming organic compounds, such as a single molecule color fixing agent for composing such a photoelectrochemical cell, by adopting the fabrication method of the organometallic complexes (organometallic compounds) described above, the organometallic compounds can stably be formed as films, and the bonding force of the junction interface can be increased.

Hereinafter, an exemplary embodiment of an electronic apparatus equipped with the organic EL device according to the invention. An electronic apparatus according to the invention can be equipped with the organic EL device described above as a display section, what is shown in FIG. 11 can specifically be cited.

Figure 11:
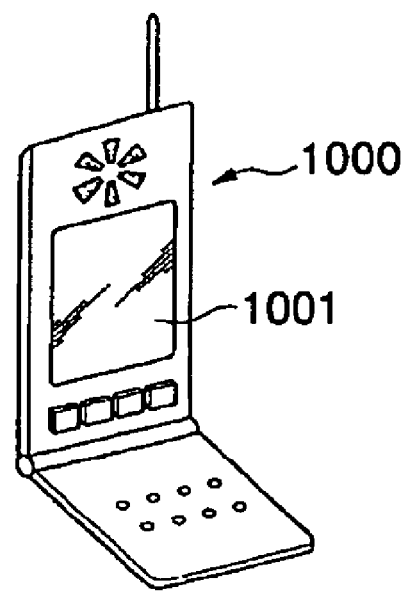
FIG. 11 is a perspective view showing an electronic apparatus according to the invention.

FIG. 11 is a perspective view showing an example of a cellular phone. In FIG. 11, a reference numeral 1000 denotes a body of the cellular phone, and a reference numeral 1001 denotes the display section applying the organic EL device.

Since the electronic apparatus shown in FIG. 11 is equipped with the display section having the organic EL device, it can enjoy a long life and obtain a blight display.

It should be understood that the invention is not limited to the exemplary embodiments described above, but can be modified in various manners to be practiced within a scope or spirit of the invention.

For example, although the polymer material is used as the light emitting layer 60 in the above embodiment, small molecule materials can also be used instead of the polymer materials. Further, the structure of the circuit section 11 is merely an example, and other structure can also be taken. Still further, although an example in which the organic EL device according to the invention is used as a display device is described above as the embodiment, the light emitting layer can be formed all over the substrate, and the device can be used as a back light (lighting installation) for transmissive liquid crystal devices.

What is claimed is:

1. A method of fabricating a thin film of an Organometallic compound on a substrate, comprising: depositing an organic material by a liquid phase process; and exposing the organic material to a metal vapor, the exposing of the organic material resulting in the organometallic compound, the step of exposing being executed after the step of depositing to form the thin film of the organometallic compound.

2. The method of forming the thin film of the organometallic compound according to claim 1, the liquid phase process being a droplet discharge method.

3. A method of fabricating an Organometallic device, comprising: forming an organic functional layer; forming a charge transfer layer; and forming an electrode, the forming the charge transfer layer further including: depositing an organic material by a liquid phase process; and exposing the organic material to a metal vapor by a vapor phase process to form a thin film of an organometallic compound, in the step of forming the charge transfer layer, the step of exposing being executed after the depositing to form the thin film of the organometallic compound.

4. The method of fabricating an organoelectronic device according to claim 3, the organometallic compound being an organometallic complex.

5. The method of fabricating an organoelectronic device according to claim 4, a central atom of the organometallic complex including a same metallic element as at least one composing element of the electrode.

6. The method of fabricating an organoelectronic device according to claim 4, the organometallic complex being a β-diketone complex.

7. The method of fabricating an organoelectronic device according to claim 3, the liquid phase process being a droplet discharge method.

8. A method of fabricating an organic electroluminescence device, comprising: forming a blue light emitting layer, a green light emitting layer, and a red light emitting layer; forming a first electron injection layer on the blue light emitting layer; and forming a second electron injection layer and a third electron injection layer, respectively, on the green light emitting layer and the red light emitting layer, the forming the second electron injection layer and the third electron injection layer including: depositing an organic material by a liquid phase process, and exposing the organic material to a metal vapor by a vapor phase process, the second electron injection layer and the third electron injection layer being organometallic compounds, in the step of forming the second electron injection layer and the third electron injection layer, the step of exposing being executed after the step of depositing to form a thin film of the organometallic compound.

9. The method of fabricating an organic electroluminescence device according to claim 8, the organometallic compounds each being an organometallic complex.

10. The method of fabricating an organic electroluminescence device according to claim 9, a central atom of the organometallic complexes including a same metallic element as at least one composing element of an electrode.

11. The method of fabricating an organic electroluminescence device according to claim 9, the organometallic complex being a $\beta$-diketone complexes each.

12. The method of fabricating an organic electroluminescence device according to claim 8, the liquid phase process being a droplet discharge method.

* * * * *